(12) United States Patent
Chen et al.

(10) Patent No.: US 11,488,946 B2
(45) Date of Patent: Nov. 1, 2022

(54) PACKAGE METHOD OF A MODULAR STACKED SEMICONDUCTOR PACKAGE

(71) Applicant: Powertech Technology Inc., Hukou Township, Hsinchu County (TW)

(72) Inventors: Yi-hsin Chen, Hukou Township, Hsinchu County (TW); Guang-Ren Shen, Hukou Township, Hsinchu County (TW); Chia-Jen Chou, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 0 days.

(21) Appl. No.: 17/150,498

(22) Filed: Jan. 15, 2021

(65) Prior Publication Data

US 2022/0130813 A1    Apr. 28, 2022

(30) Foreign Application Priority Data

Oct. 27, 2020   (TW) ................................. 109137337

(51) Int. Cl.
  *H01L 21/78*   (2006.01)
  *H01L 21/48*   (2006.01)
  (Continued)

(52) U.S. Cl.
  CPC .......... *H01L 25/50* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 21/78* (2013.01); *H01L 23/3121* (2013.01); *H01L 23/5383* (2013.01); *H01L 23/5386* (2013.01); *H01L 23/5389* (2013.01);
  (Continued)

(58) Field of Classification Search
  CPC ... H01L 25/50; H01L 25/0657; H01L 25/105; H01L 21/4853; H01L 21/4857; H01L 21/565; H01L 21/568; H01L 21/6835; H01L 21/78; H01L 23/3121; H01L 23/5383; H01L 23/5386; H01L 23/5389; H01L 24/19; H01L 24/20; H01L 2224/214; H01L 2221/68327; H01L 2221/38372; H01L 2225/06548; H01L 2225/06562; H01L 2225/06582; H01L 2225/1035
  See application file for complete search history.

(56) References Cited

U.S. PATENT DOCUMENTS

2019/0355637 A1* 11/2019 Chen ...................... H01L 23/28

* cited by examiner

*Primary Examiner* — Timor Karimy
(74) *Attorney, Agent, or Firm* — Patenttm.us

(57) ABSTRACT

A package method of modular stacked semiconductor package is disclosed. A carrier and a plurality of the chip modules are provided. A plurality of redistribution layers are respectively formed in device areas of the carrier. The chip modules are stacked on the corresponding device areas of the carrier and are electrically connected to each other. A molding compound is formed on the redistribution layers on the carrier to encapsulate the chip modules. The carrier is removed to expose the redistribution layers. A plurality of solder balls are formed on the exposed redistribution layers. The molding compound is cut along adjacent edges of the device areas to form a plurality of modular stacked semiconductor packages. Since the chip modules are previously fabricated, connecting quality among the stacked chip modules is enhanced and is not affected by positioning error.

11 Claims, 18 Drawing Sheets

(51) Int. Cl.
 *H01L 25/00* (2006.01)
 *H01L 21/56* (2006.01)
 *H01L 21/683* (2006.01)
 *H01L 23/31* (2006.01)
 *H01L 23/538* (2006.01)
 *H01L 23/00* (2006.01)
 *H01L 25/065* (2006.01)
 *H01L 25/10* (2006.01)

(52) U.S. Cl.
 CPC .............. *H01L 24/19* (2013.01); *H01L 24/20* (2013.01); *H01L 25/0657* (2013.01); *H01L 25/105* (2013.01); *H01L 2221/68327* (2013.01); *H01L 2221/68372* (2013.01); *H01L 2224/214* (2013.01); *H01L 2225/06548* (2013.01); *H01L 2225/06562* (2013.01); *H01L 2225/06582* (2013.01); *H01L 2225/1035* (2013.01)

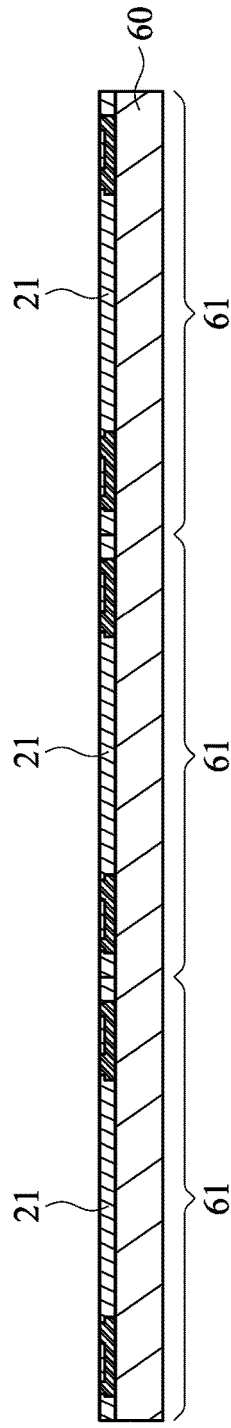
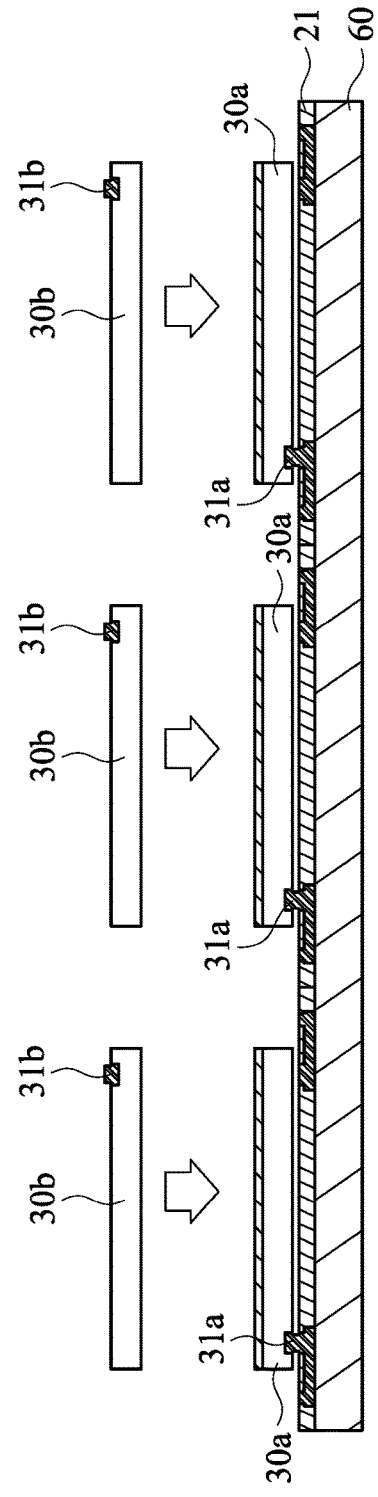
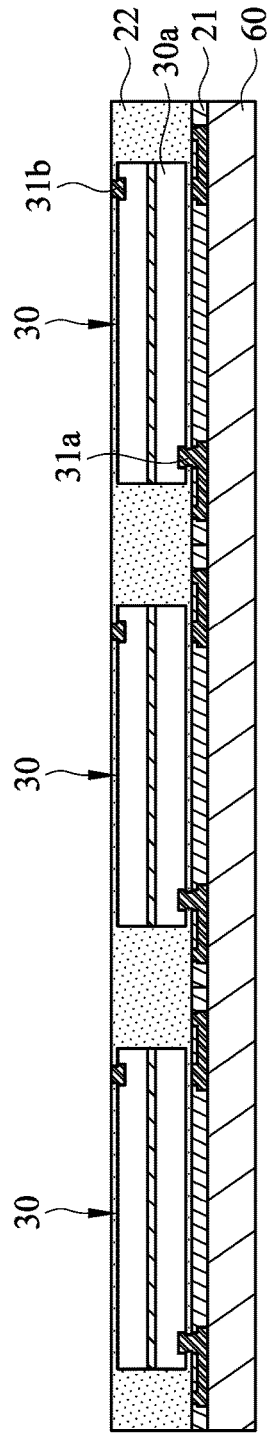
FIG. 1A
FIG. 1B
FIG. 1C

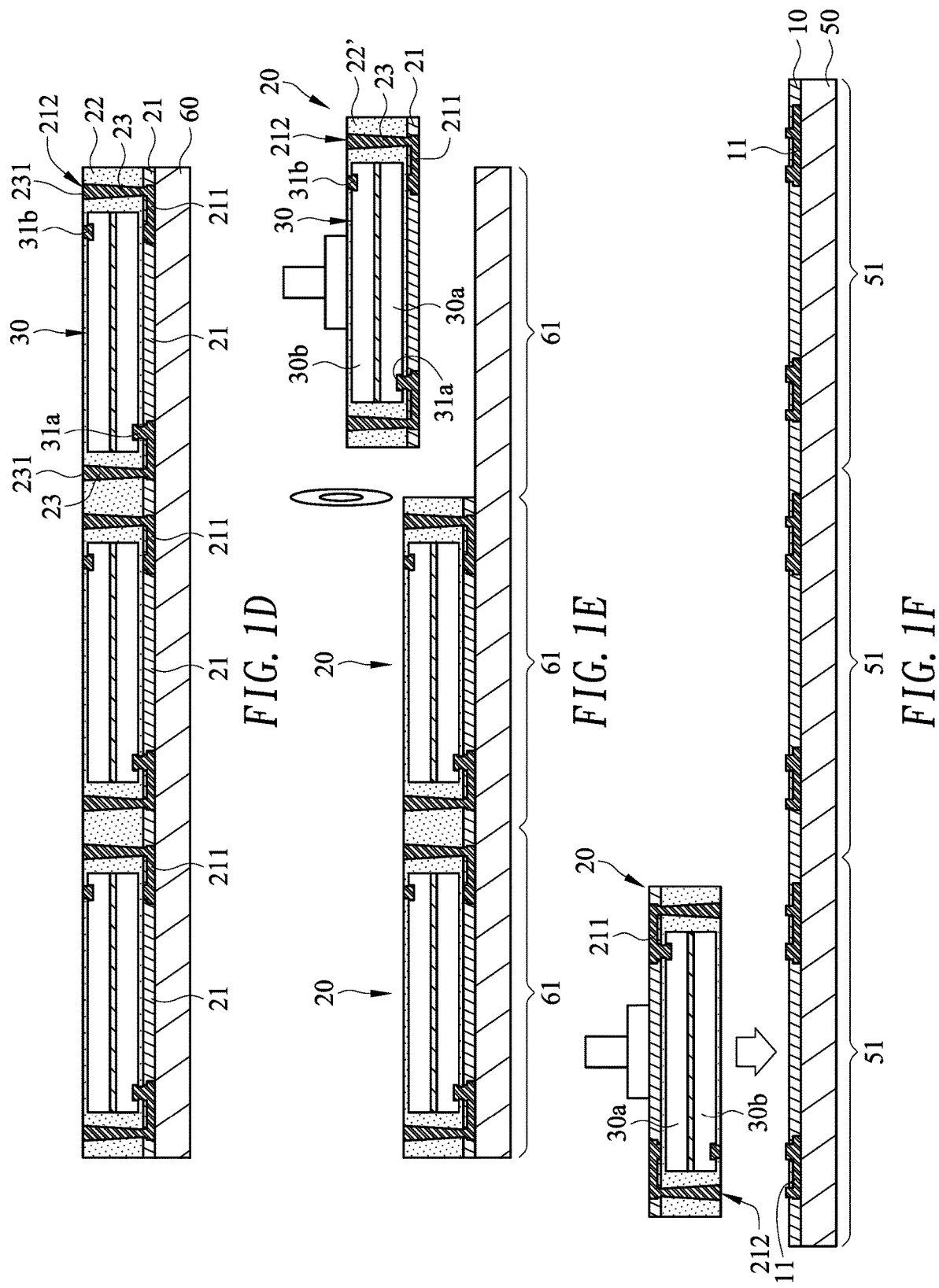

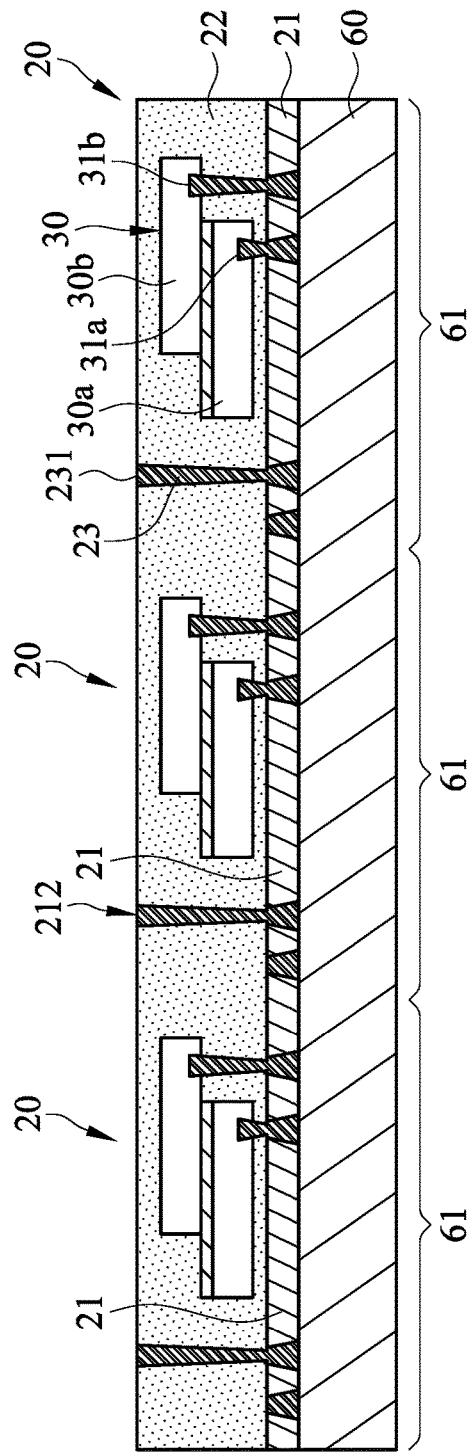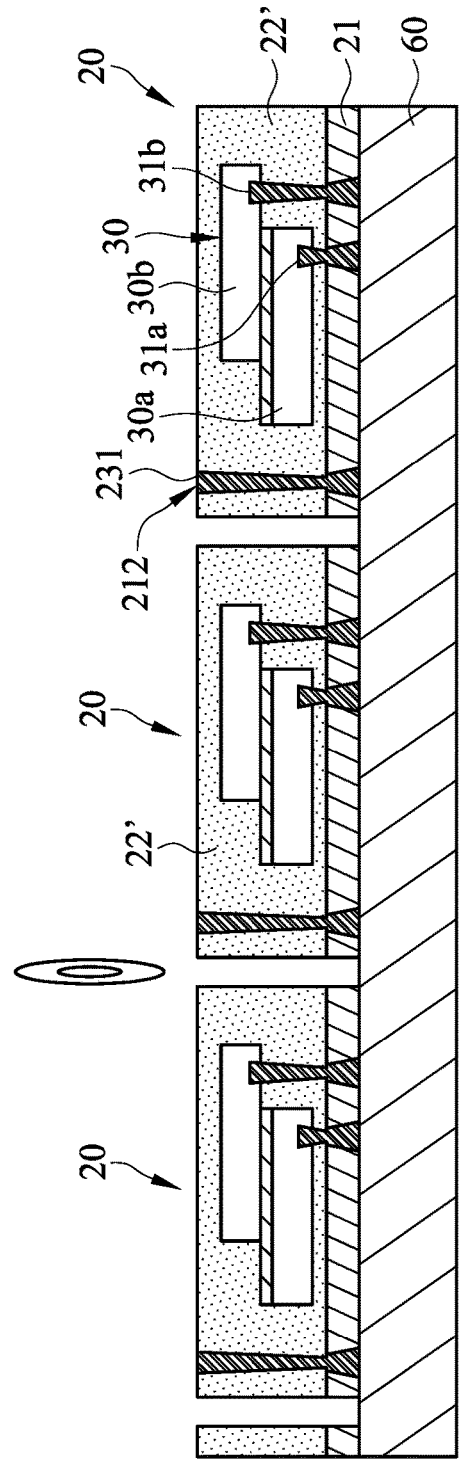
FIG. 2A
FIG. 2B

PACKAGE METHOD OF A MODULAR STACKED SEMICONDUCTOR PACKAGE

CROSS-REFERENCE TO RELATED APPLICATIONS

This application is based upon and claims priority under 35 U.S.C. 119 from Taiwan Patent Application No. 109137337 filed on Oct. 27, 2020, which is hereby specifically incorporated herein by this reference thereto.

BACKGROUND OF THE INVENTION

1. Field of the Invention

The present invention is related to a package method of a stacked semiconductor package, and more particularly to a package method of a modular stacked semiconductor package.

2. Description of the Prior Arts

In a conventional package method of a stacked semiconductor package, bare chips are provided to package at first. In one of the conventional package method, the bare chips are stacked on a substrate or a first carrier in sequence and are encapsulated at once by single encapsulation to form the package. In another conventional package method, a first tier of the bare chip is disposed on the substrate or the first carrier and is encapsulated by a first tier of a encapsulation. A first circuit layer is formed on the first tier of the encapsulation. A second tier of the bare chip is disposed on the first circuit layer and is encapsulated by a second tier of a encapsulation. In this conventional method, N times of the foregoing steps are repeated to form a package with N tiers.

However, in the foregoing conventional methods, the bare chips are disposed at different location at different times, so that the bare chips disposed at different tiers may misalign to decrease the yield of the package.

To overcome the shortcomings, the present invention provides a package method of a modular stacked semiconductor package to mitigate or to obviate the aforementioned problems.

SUMMARY OF THE INVENTION

An objective of the present invention is to provide a package method of a modular stacked semiconductor package to obviate the aforementioned problems.

To achieve the objectives as mentioned above, the package method comprising steps of:

(a) providing a first carrier and N*M chip modules, wherein the first carrier has M device areas, and each of the chip modules has a first encapsulation and a bare chip group encapsulated by the first encapsulation;

(b) forming a first redistribution layer on each of the device areas on the first carrier;

(c) stacking the N chip modules on the first redistribution layer on each of the device areas of the first carrier and electrically connecting the N chip modules to each other;

(d) forming a second molding compound on the first redistribution layers on the first carrier to encapsulate the chip modules;

(e) removing the first carrier to expose a surface on each of the first redistribution layers, and forming a plurality of solder balls on the surfaces of the first redistribution layers; and (f) cutting the second molding compound along adjacent edges of the device areas to form a plurality of modular stacked semiconductor packages with N tiers.

In conclusion, the chip modules are fabricated in advance. Each of the chip modules has the stacked bare chips. When the chip modules are used to manufacture the stacked package, the issue of bad electrically connection between the bare chips in the chip module caused by positioning error is drastically reduced. Then the yield of package method of stacked semiconductor package method with stacked multiple tiers is also enhanced.

Other objectives, advantages and novel features of the invention will become more apparent from the following detailed description when taken in conjunction with the accompanying drawings.

BRIEF DESCRIPTION OF THE DRAWINGS

FIGS. 1A to 1K are schematic cross sectional views of different steps of a first embodiment of a package method of a modular stacked semiconductor package in accordance with the present invention;

FIGS. 2A to 2F are schematic cross sectional views of different steps of a second embodiment of a package method of a modular stacked semiconductor package in accordance with the present invention.

DETAILED DESCRIPTION OF THE EMBODIMENTS

Figure 1G:
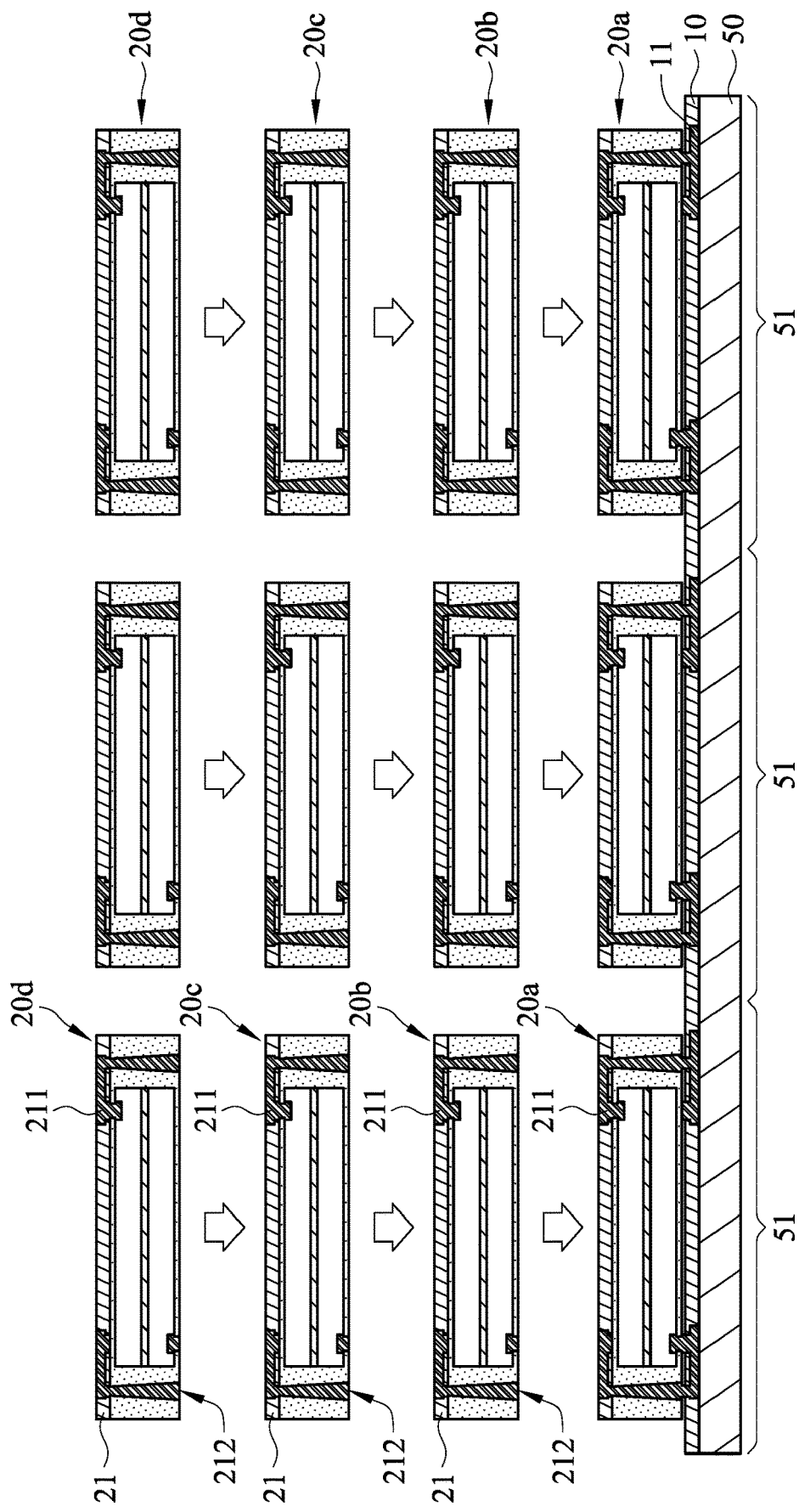

The present invention relates to a package method of a modular stacked semiconductor package. With embodiments and drawings thereof, the features of the present invention are described in detail as fallow.

With reference from FIGS. 1A to 1K, a package method of a modular stacked semiconductor package in accordance with present invention comprises following steps (a) to (f):

With reference to FIGS. 1E and 1F, in step (a), a first carrier 50 and N*M chip modules 20 are provided. The first carrier 50 has M device areas 51. Each of the chip modules 20 has a first encapsulation 22' and a bare chip group 30 encapsulated by the first encapsulation 22'. In this embodiment, each of the chip modules 20 is fabricated by a first method as shown in FIGS. 1A to 1E. With reference to FIG. 1A, a second carrier 60 and a plurality of bare chips 30a, 30b are provided. The second carrier 60 has a plurality of modular areas 61. A second redistribution layer 21 is formed on each of the modular areas 61. With reference to FIG. 1B, each of the bare chips 30a is flip-chip bonded on the second redistribution layer 21 by a metal pad 31a on an active surface thereof. The bare chips 30b are disposed on a rear surface of the bare chips 30a. Each of the bare chips 30b has a metal pad 31b on an active surface thereof. The metal pads 31b are disposed away from the second redistribution layer 21. The bare chips 30a and 30b are stacked with four sides respectively aligning with each other. With reference to FIG. 1C, a first molding compound 22 is formed on the second redistribution layers 21 to encapsulate the bare chips 30a and 30b. With reference to FIG. 1D, each of the modular areas 61 has at least one hole. The at least one hole is formed through the first molding compound 22, and is filled with metal materials to form a conductive via 23, i.e. the conductive via 23 is electroplated in the hole to constitute the metal materials. The first molding compound 22 is polished to expose the metal pads 31*b*. One end 231 of each of the conductive vias 23 is exposed out of the first molding compound 22. The metal pads 31*b* and the ends 231 of the conductive vias 23 constitute a first pad group 212. With reference to FIG. 1E, the first molding compound 22 is cut along adjacent edges of the modular areas 61 to form the chip modules 20. Each of the second redistribution layers 21 has a second pad group 211 on an exposed surface.

With reference to FIG. 1F, in the step (b), each of the device areas 51 on the first carrier 50 has a first redistribution layer 10 formed thereon. In this embodiment, the first redistribution layers 10 on the device areas 51 are formed simultaneously.

Figure 1H:
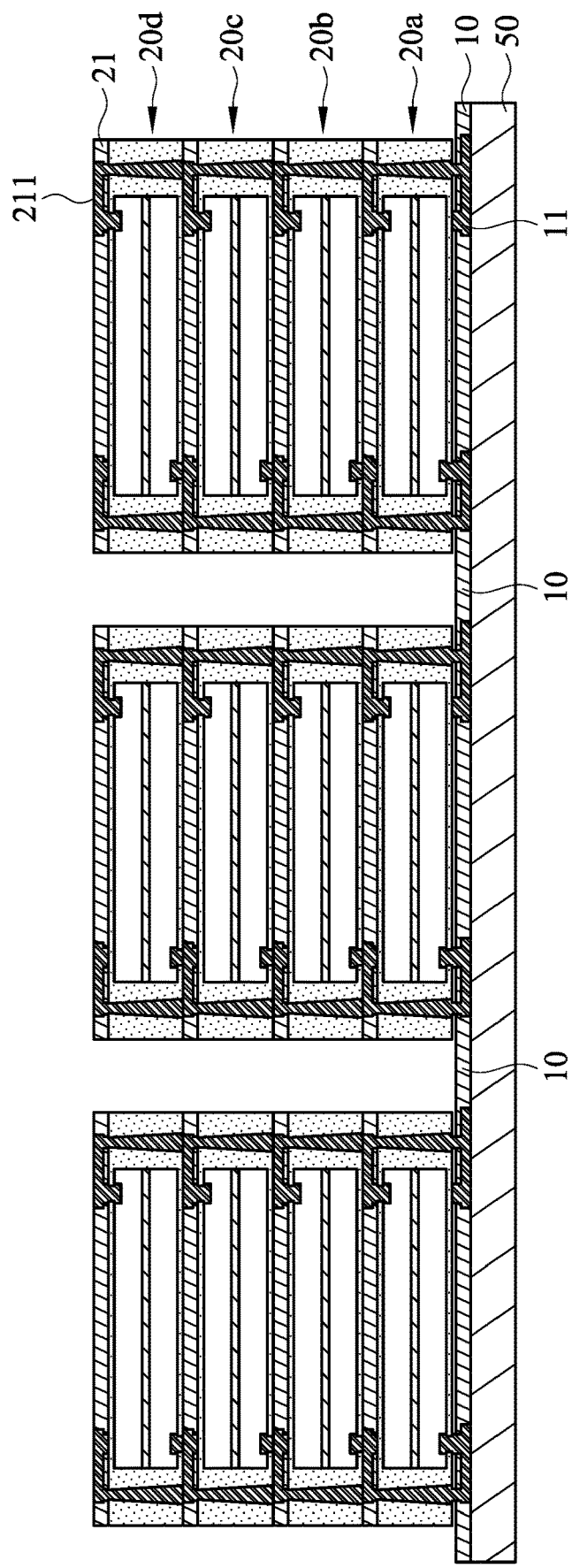

With reference to FIGS. 1F, 1G and 1H, in the step (c), the N chip modules 20*a*-20*d* are stacked as multiple tiers on the first redistribution layer 10 on each of the device areas 51 of the first carrier 50 and are electrically connected to each other. In this embodiment, the first pad groups 212 of the chip modules 20*a* in a first tier are disposed toward the first carrier 50 and are electrically connected to the first redistribution layers 10 on the corresponding device areas 51. The second pad groups 211 of the chip modules 20*a* in the first tier are disposed away from the first redistribution layers 10. Then, the first pad groups 212 of the chip modules 20*b* in a second tier are disposed toward the second pad groups 211 of the chip modules 20*a* in the first tier and are electrically connected to the corresponding second pad group 211. The second pad groups 211 of the chip modules 20*b* in the second tier are disposed away from the first redistribution layers 10. Then, N times of the foregoing steps are repeated to N tiers. In this embodiment as shown in FIG. 1H, N is equal to 4. That is, the first pad groups 212 of the chip modules 20*c* in a third tier are disposed toward the second pad groups 211 of the chip modules 20*b* in the second layer and are electrically connected to the corresponding second pad groups 211. The second pad groups 211 of the chip modules 20*c* in the third tier are disposed away from the first redistribution layers 10. Then, the first pad groups 212 of the chip modules 20*d* in a fourth tier are disposed toward the second pad groups 211 of the chip modules 20*c* in the third layer and are electrically connected to the corresponding second pad groups 211. The second pad groups 211 of the chip modules 20*d* in the fourth layer are disposed away from the first redistribution layers 10.

Figure 1I:
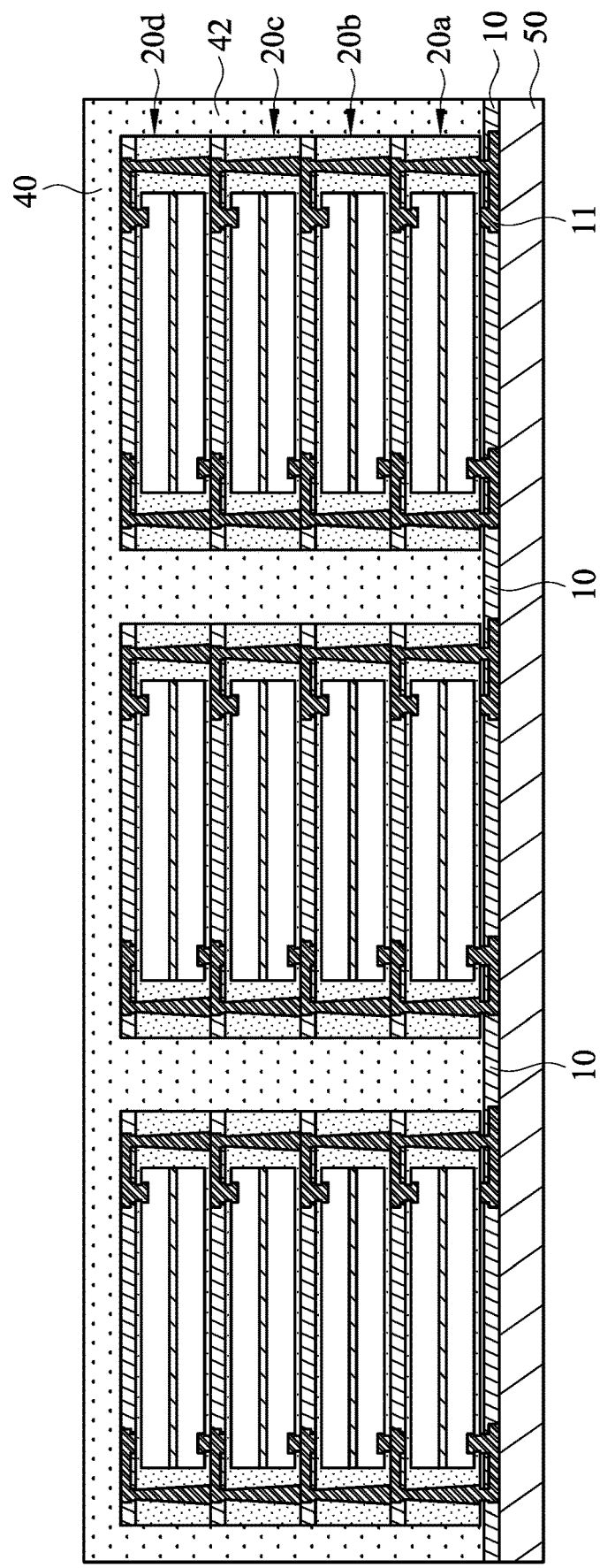

With reference to FIG. 1I, in the step (d), each of the first redistribution layers 10 on the first carrier 50 has a second molding compound 40 formed thereon. The second molding compound 40 is encapsulated the chip modules 20*a*-20*d*.

In the step (e), the first carrier 50 is removed to expose a surface 11 on each of the first redistribution layers 10. A plurality of solder balls 12 are formed on the surfaces 11.

Figure 1J:
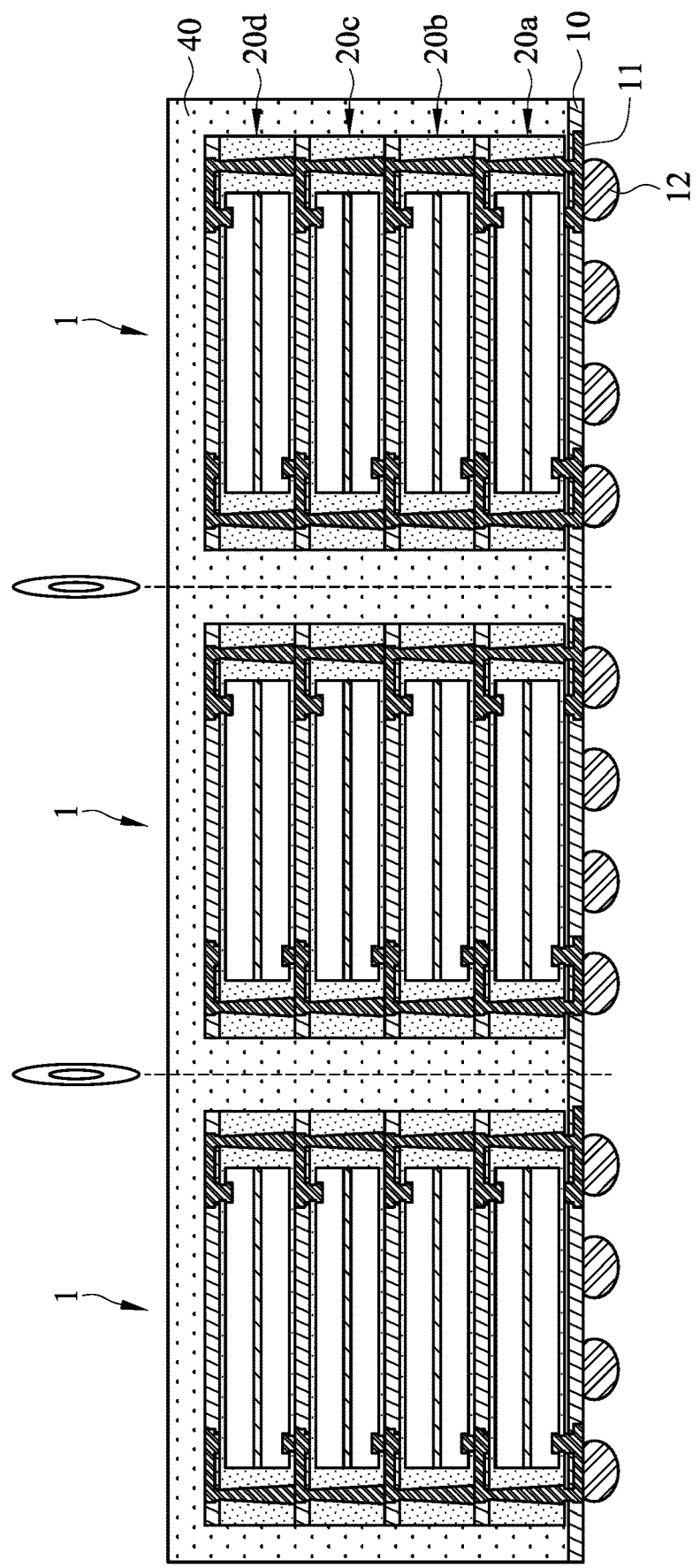
Figure 1K:
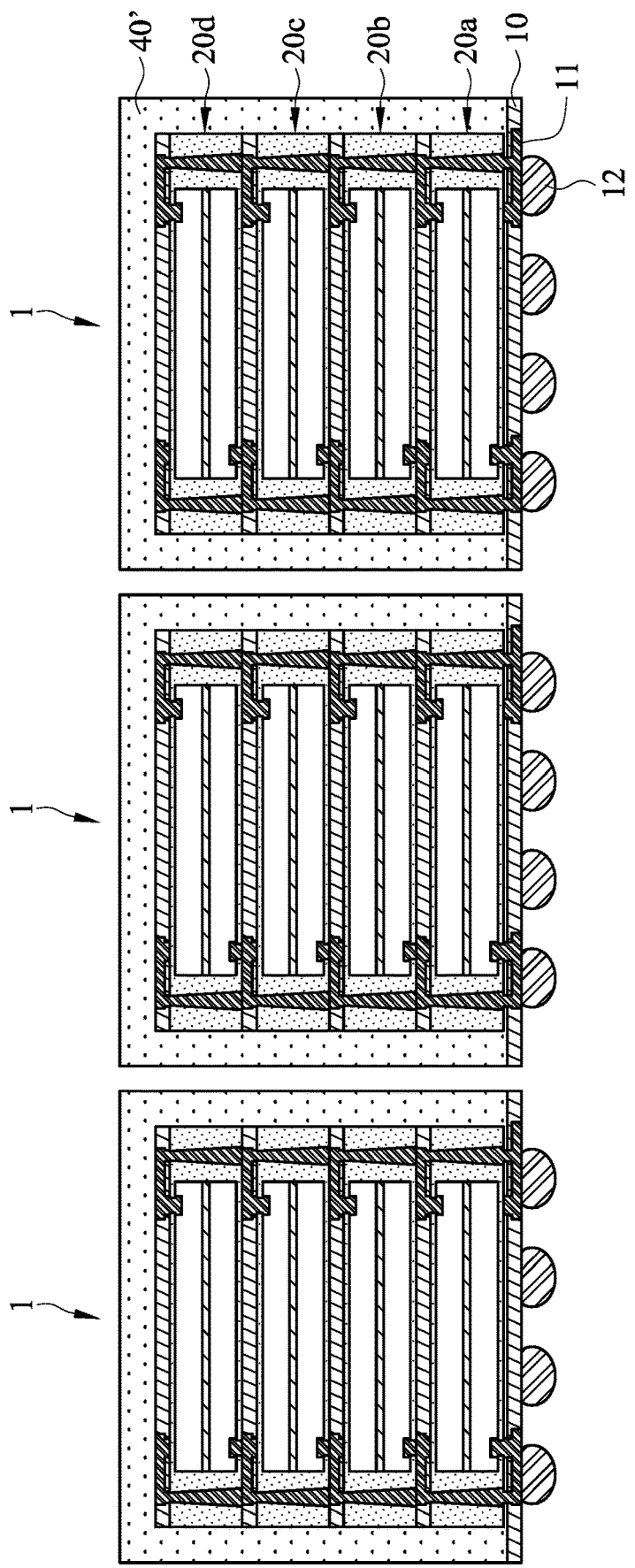

With reference to FIGS. 1I and 1J, in the step (f), the second molding compound 40 is cut along adjacent edges of the device areas 51 to form a plurality of modular stacked semiconductor packages 1 with N tiers. In this embodiment, each of the modular stacked semiconductor packages 1 has four tiers with the chip modules 20*a*-20*d* encapsulated by the second encapsulation 40'. Each of the chip modules 20*a*-20*d* has two bare chips 30*a* and 30*b* stacked back to back with four sides respectively aligning with each other. With reference to FIG. 1E, the metal pads 31*b* on the active surface of the bare chips 30*b* and the end 231 of the conductive vias 23 forms the first pad group 212. The metal pad 31*a* on the active surface of the bare chip 30*a* is electrically connected to the second pad group 211 and is encapsulated by the second encapsulation 40'.

Figure 2C:
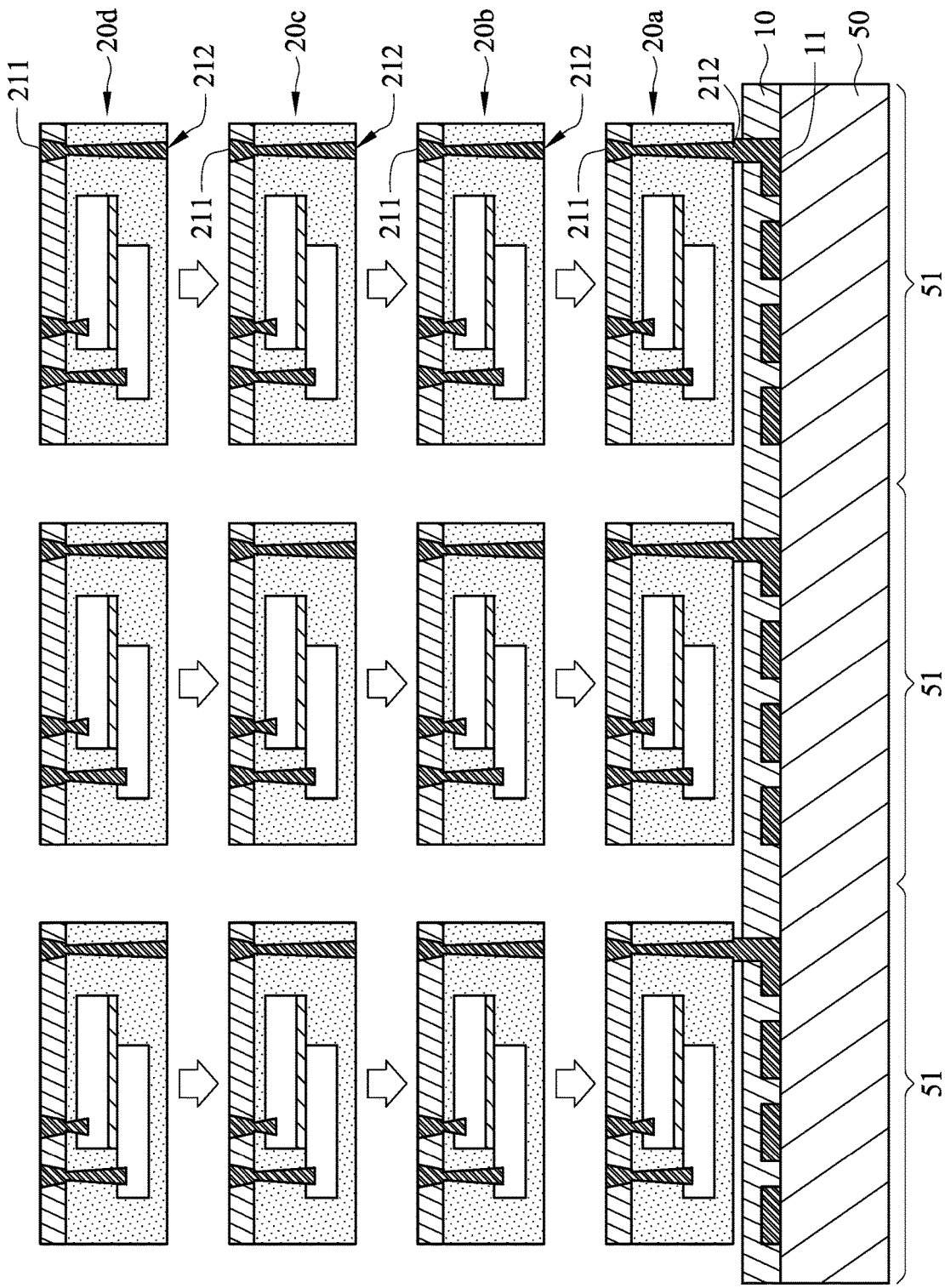

With reference to FIGS. 2B to 2F, a second embodiment of a package method in accordance with present invention has similar steps with the steps (a) to (f) as shown in FIGS. 1F to 1K, but the fabrication method of the chip modules 20 is different in the step (a). With reference to FIG. 2A, the second carrier 60 and the bare chips 30*a*, 30*b* are provided. The second carrier 60 has the modular areas 61. Each of the modular areas 61 has the second redistribution layer 21 formed thereon. Each of the bare chips 30*a* is flip-chip bonded on one of the second redistribution layers 21 by the metal pad 31*a* on the active surface thereof. The active surface of each of the bare chips 30*b* is disposed on the rear surface of one of the bare chips 30*a*. Each of the bare chips 30*b* is flip-chip bonded on the second redistribution layer 21 by the metal pad 31*b* thereof. The first molding compound 22 is formed on the second redistribution layers 21 to encapsulate the bare chips 30*a* and 30*b*. Each of the modular areas 61 has a least one hole. The at least one hole is formed through the first molding compound 22 and is filled with metal materials to form a conductive via 23. One end 231 of each of the conductive vias 23 is exposed out of the first molding compound 22. The ends 231 of the conductive vias 23 constitute the first pad group 212. Each of the conductive vias 23 has another end electrically connected to the second redistribution layer 21. With reference to FIGS. 2A and 2B, the first molding compound 22 is cut along adjacent edges of the modular areas 61 to form the chip modules 20. That is, each of the chip modules 20 has the bare chip group 30 encapsulated by the first encapsulation 22'. Each of the second redistribution layers 21 has the second pad group 211 on an exposed surface. In this embodiment, the second pad group 211 has an exposed pad correspond to an exposed pad of the first pad group 212, i.e. the exposed end 231 of the conductive via 23.

When the chip modules 20 are fabricated by the foregoing method, then the steps (b) to (f) are executed as shown in FIGS. 2C to 2F.

With reference to FIG. 2C, in the step (b), each of the device areas 51 on the first carrier 50 has the first redistribution layer 10 formed thereon. In this embodiment, the first redistribution layers 10 on the device areas 51 are formed simultaneously.

With reference to FIG. 2C, in the step (c), the chip modules 20*a* in the first tier are electrically connected to the corresponding first redistribution layers 10. The second pad groups 211 are disposed upward. The chip modules 20*b*-20*d* in the second tier to the fourth tier are electrically connected to the second pad group 211 of the previous tier and are stacked tier by tier.

Figure 2D:
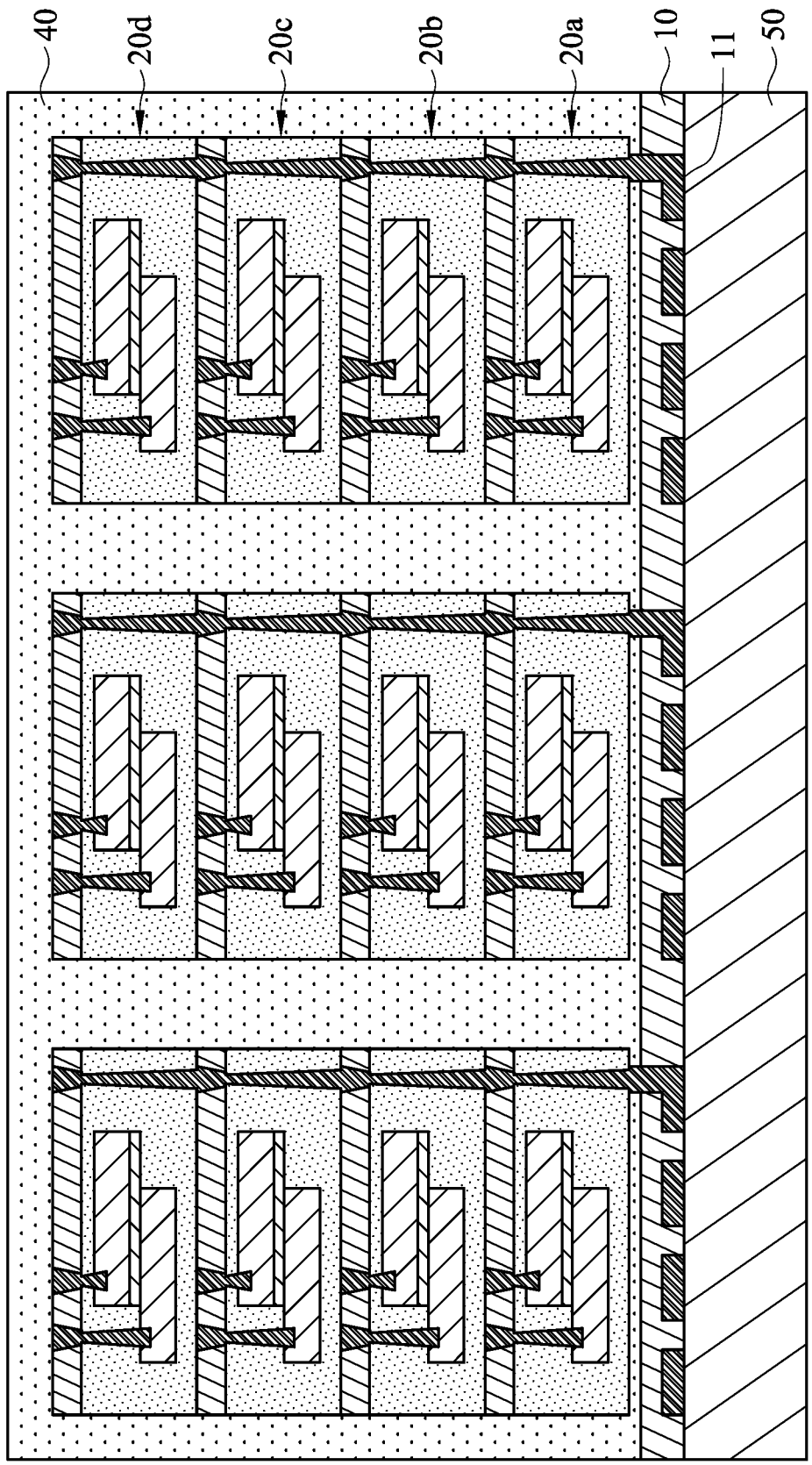

With reference to FIG. 2D, in the step (d), the first redistribution layers 10 on the first carrier 50 have the second molding compound 40 formed thereon to encapsulate the chip modules 20*a*-20*d*.

Figure 2E:
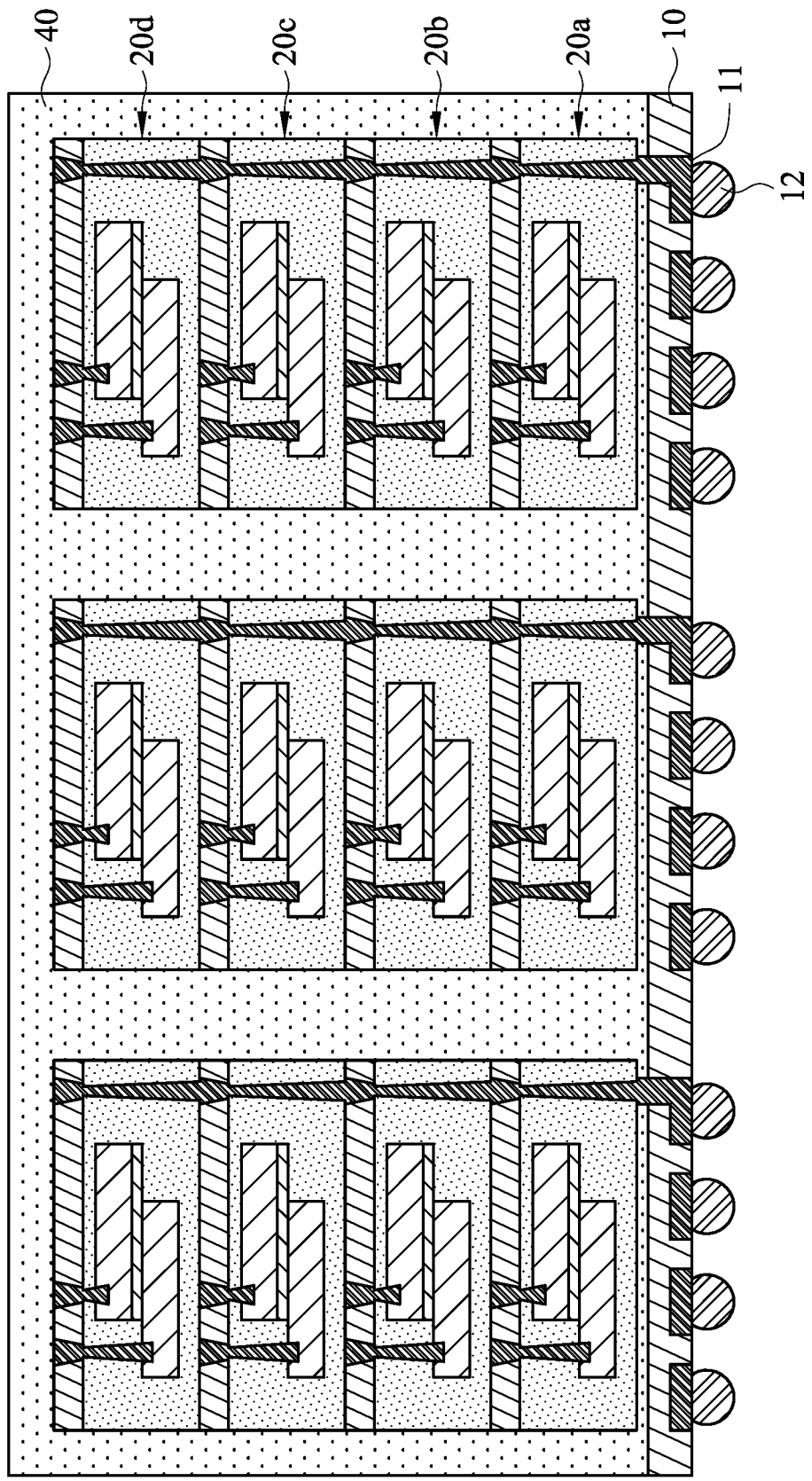

With reference to FIGS. 2D and 2E, in the step (e), each of the first redistribution layers 10 exposes the surface 11 by removing the first carrier 50. The solder balls 12 are formed on the surfaces 11.

Figure 2F:
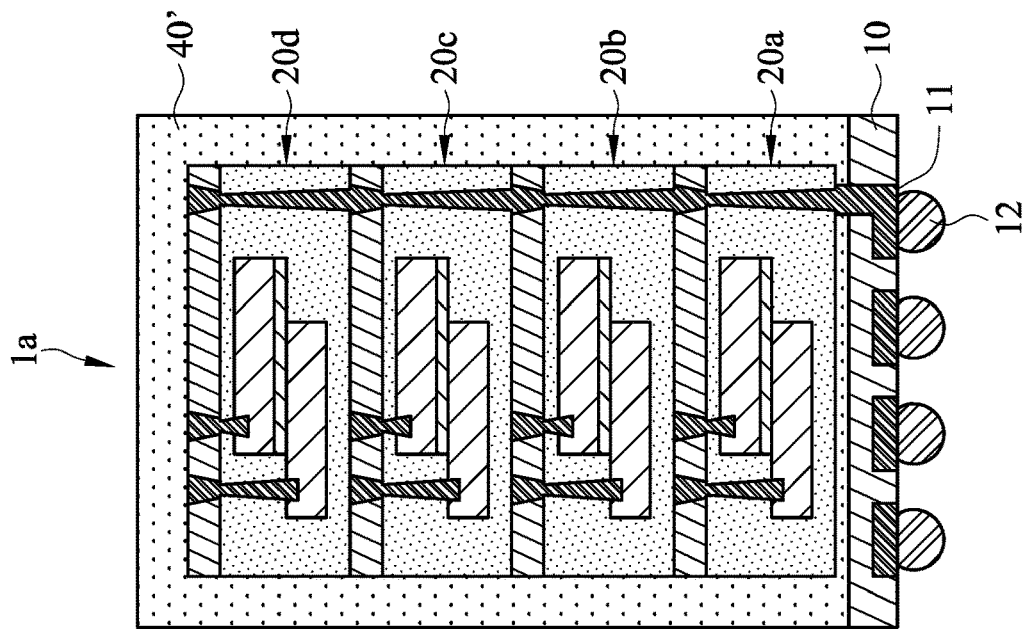
Figure 2F:
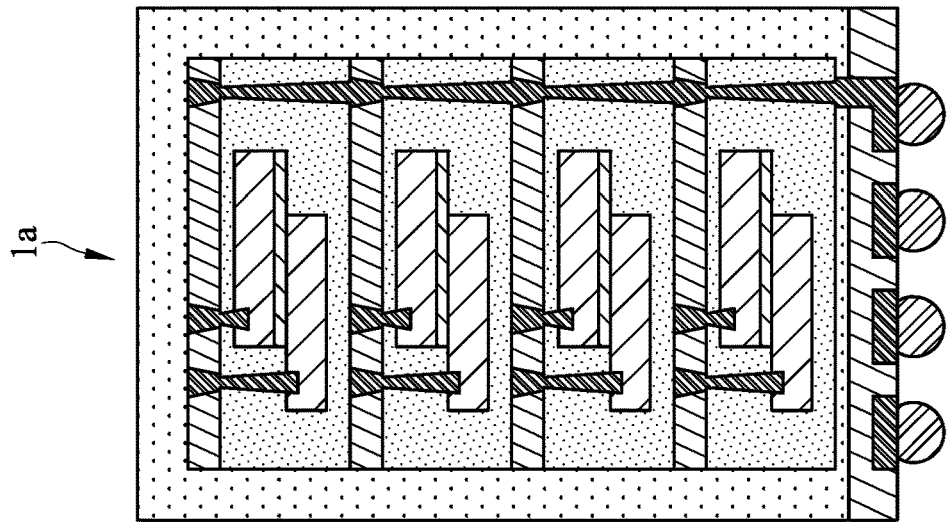
Figure 2F:
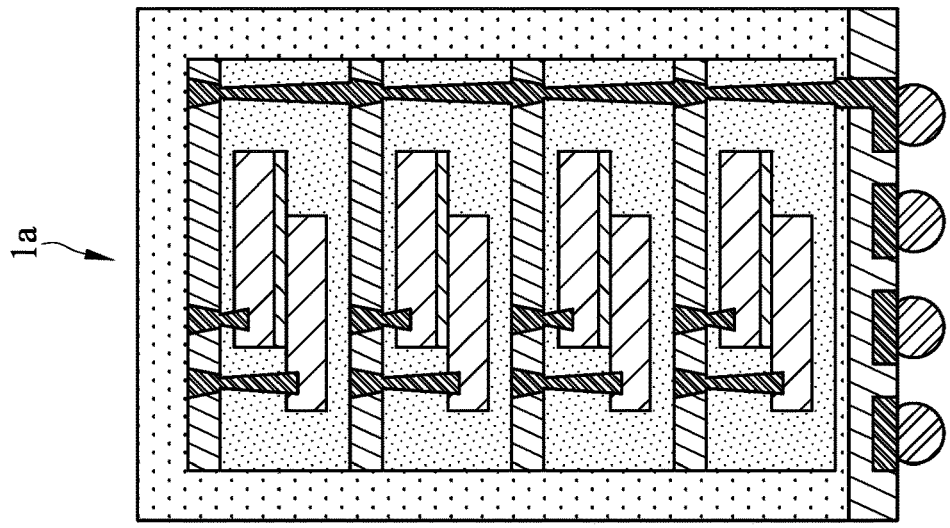

With reference to FIGS. 2E and 2F, in the step (f), the second molding compound 40 is cut along adjacent edges of the device areas 51 to form a plurality of modular stacked semiconductor packages 1*a* with N tiers. In this embodiment, each of the modular stacked semiconductor packages 1*a* has four tiers with the chip modules 20*a*-20*d* encapsulated by the second encapsulation 40'. With reference to FIGS. 2B and 2C, each of the chip modules 20*a*-20*d* has the two bare chips 30*a* and 30*b* stacked and misaligning with each other with the active surfaces facing to the same direction to expose the metal pads 31a and 31b. The metal pads 31a and 31b correspond to the second pad group 211. The at least one conductive via 23 is electrically connected to the first pad group 212 and the second pad group 211.

Figure 3A:
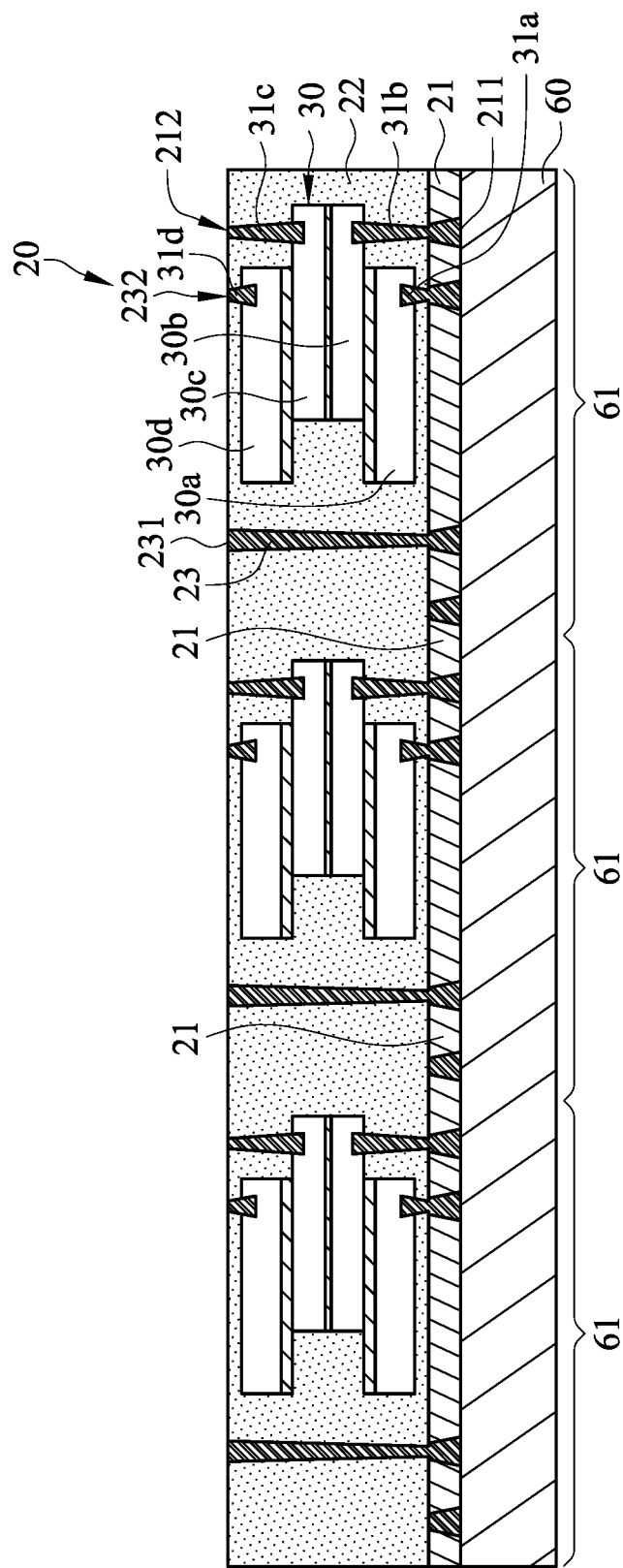
FIGS. 3A to 3F are schematic cross sectional views of different steps of a third embodiment of a package method of a modular stacked semiconductor package in accordance with the present invention.
Figure 3B:
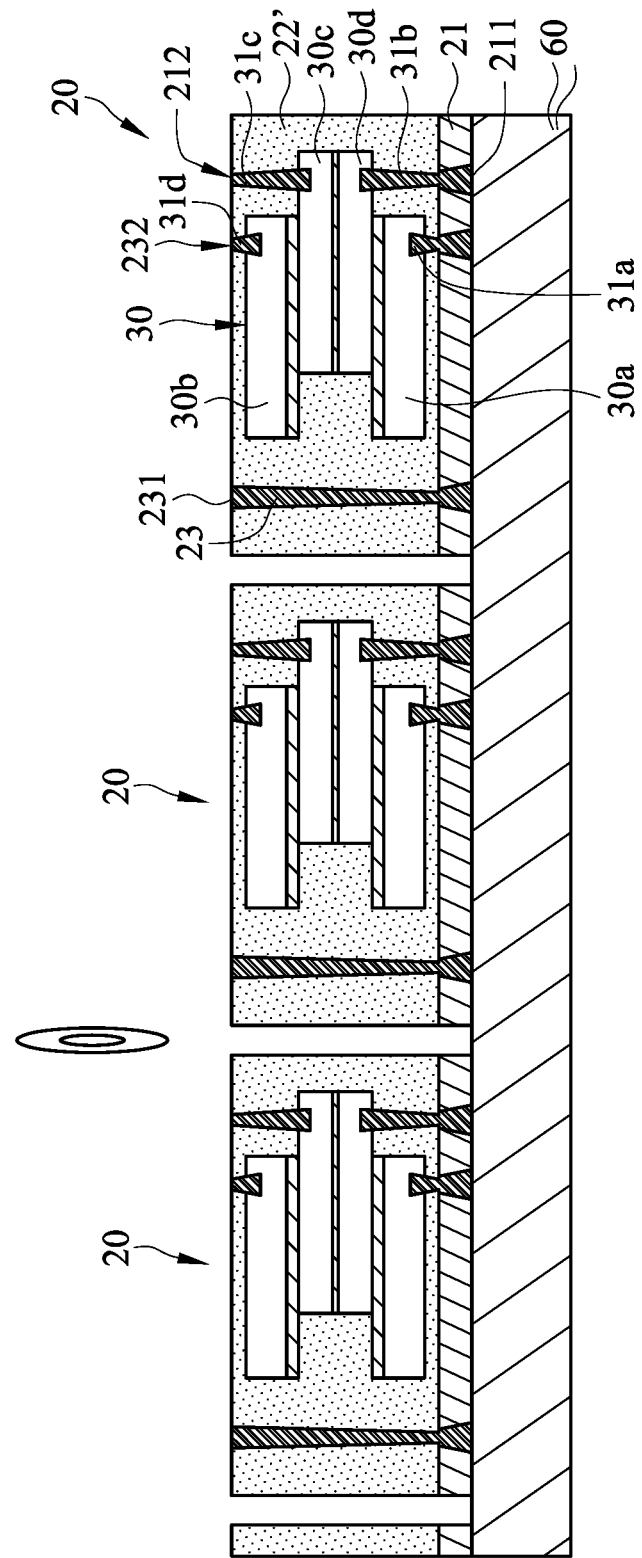

With reference to FIGS. 3B to 3F, a third embodiment of a package method in accordance with present invention has similar steps with the steps (a) to (f) as shown in FIGS. 1F to 1K, but the fabrication method of the chip modules 20 is different in the step (a). With reference to FIG. 3A, the second carrier 60 and a plurality of first and second bare chips 30a-30d are provided. The second carrier 60 has the modular areas 61. Each of the modular areas 61 has the second redistribution layer 21 formed thereon. Each of the second bare chips 30a in a first tier is flip-chip bonded on the second redistribution layer 21 by the metal pad 31a on the active surface thereof. The active surface of each of the first bare chips 30b in a second tier is mounted on a rear surface of one of the second bare chips 30a in the first tier. Each of the first bare chips 30b is flip-chip bonded on one of the second redistribution layers 21 by the metal pad 31b on the active surface thereof. The rear surface of each of the first bare chips 30c in a third tier is completely mounted on the rear surface of one of the first bare chips 30b in the second tier. Each of the first bare chips 30c has the metal pad 31c on the active surface thereof. The metal pads 31c correspond to the first pad group 212. The rear surface of each of the second bare chips 30d on a fourth tier is partially mounted on the active surface of one of the first bare chips 30c in the third tier. Each of the second bare chips 30d has the metal pad 31d on the active surface thereof. The metal pads 31d correspond to the first pad group 212. The first molding compound 22 is formed on the second redistribution layers 21 to encapsulate the bare chips 30a-30d. Each of the modular areas 61 has a least one hole. The at least one hole is formed through the first molding compound 22 and is filled with metal materials to form the conductive via 23. One end 231 of each of the conductive vias 23 is exposed out of the molding compound 22. The ends 231 and the metal pads 31c and 31d are constitute the first pad group 212 of the each of the chip modules 20. Each of the conductive vias 23 has another end electrically connected to the second redistribution layer 21. With reference to FIGS. 3A and 3B, the first molding compound 22 is cut along adjacent edges of the modular areas 61 to form the chip modules 20. That is, each of the chip modules 20 has the bare chip group 30 encapsulated by the first encapsulation 22'. Each of the second redistribution layers 21 has the second pad group 211 on an exposed surface. In this embodiment, the second pad group 211 has an exposed pad correspond to an exposed pad of the first pad group 212, i.e. the exposed end 231 of the conductive via 23.

When the chip modules 20 are fabricated by the foregoing method, then the steps (b) to (f) are executed as shown in FIGS. 3C to 3F.

Figure 3C:
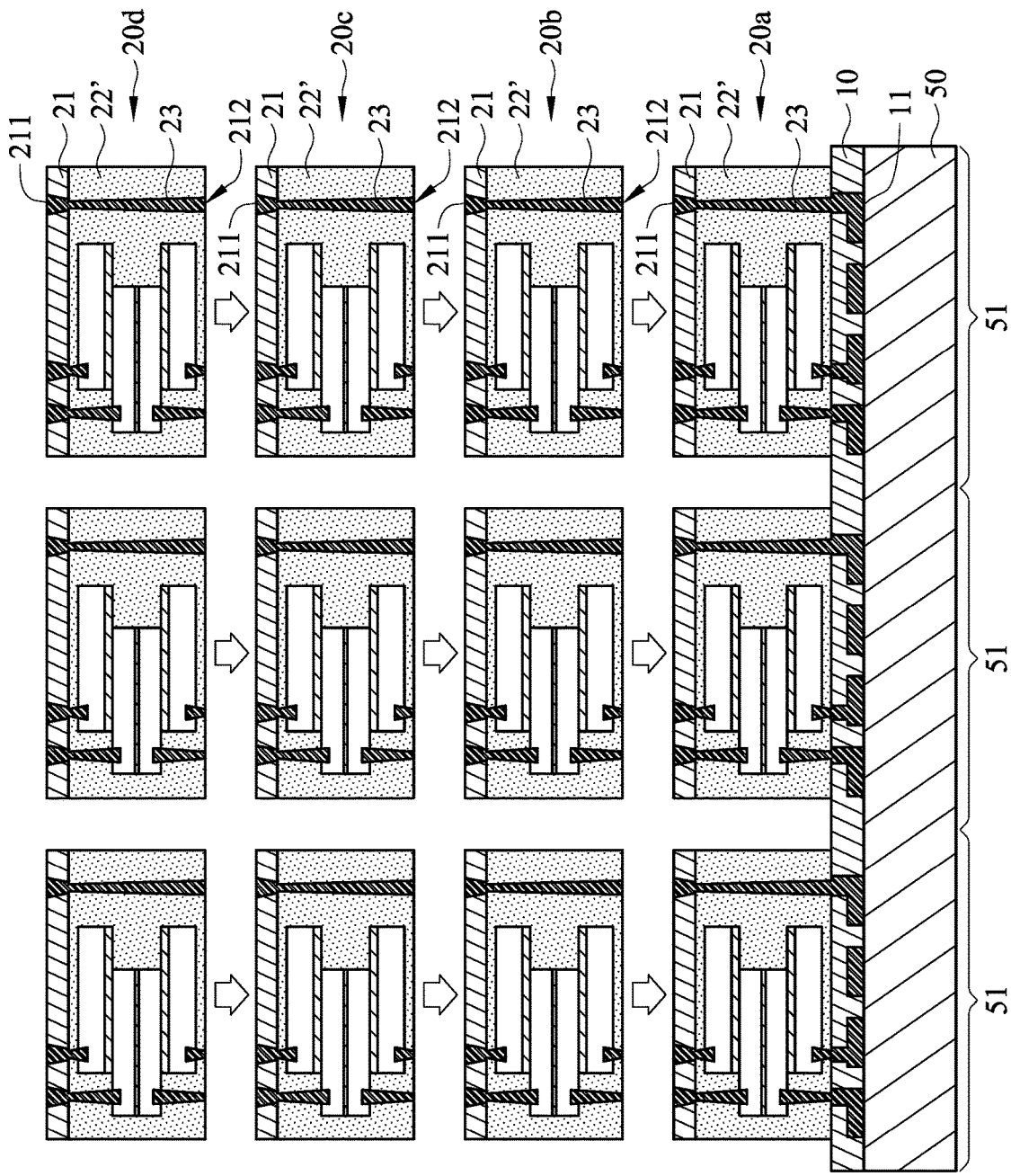

With reference to FIG. 3C, in the step (b), each of the device areas 51 on the first carrier 50 has the first redistribution layer 10 formed thereon. In this embodiment, the first redistribution layers 10 on the device areas 51 are formed simultaneously.

With reference to FIG. 3C, in the step (c), the chip modules 20a in the first tier are electrically connected to the corresponding first redistribution layer 10. The second pad groups 211 are disposed upward. The chip modules 20b-20d in the second tier to the fourth tier are electrically connected to the second pad group 211 of the previous tier and are stacked tier by tier.

Figure 3D:
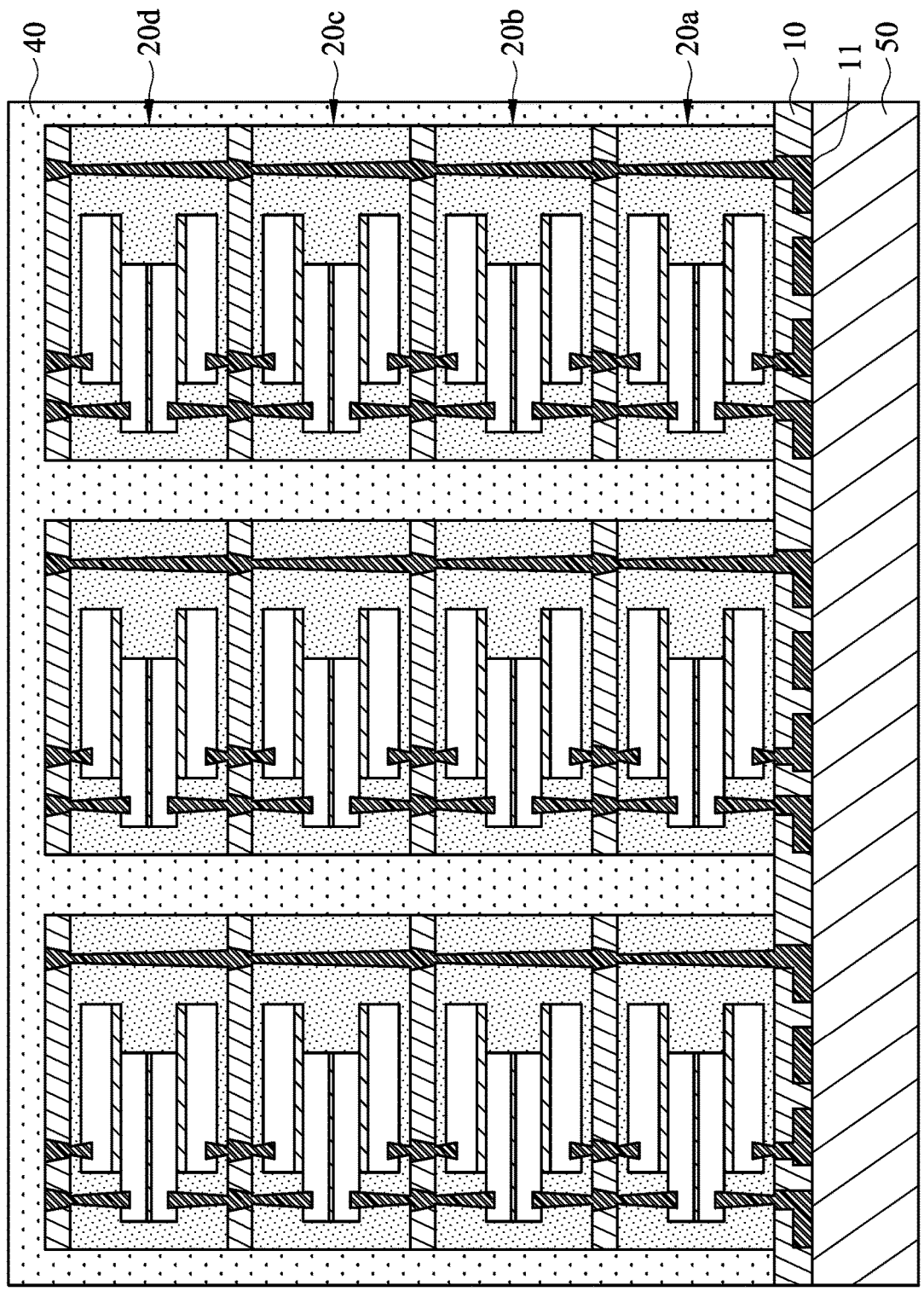

With reference to FIG. 3D, in the step (d), the first redistribution layers 10 on the first carrier 50 have the second molding compound 40 formed thereon to encapsulate the chip modules 20a-20d.

Figure 3E:
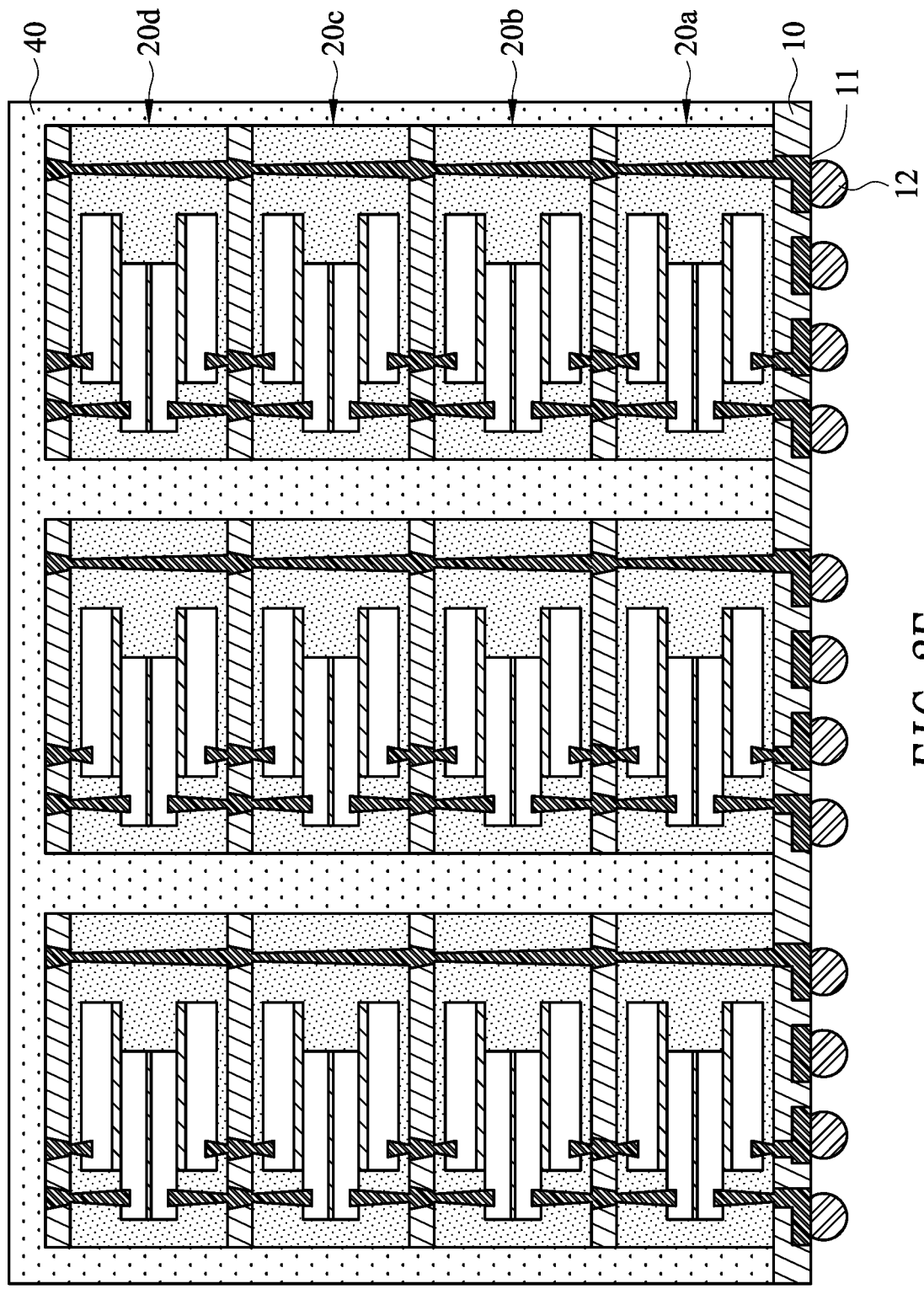

With reference to FIGS. 3D and 3E, in the step (e), each of the first redistribution layers 10 exposes the surface 11 by removing the first carrier 50. the solder balls 12 are formed on the surfaces 11.

Figure 3F:
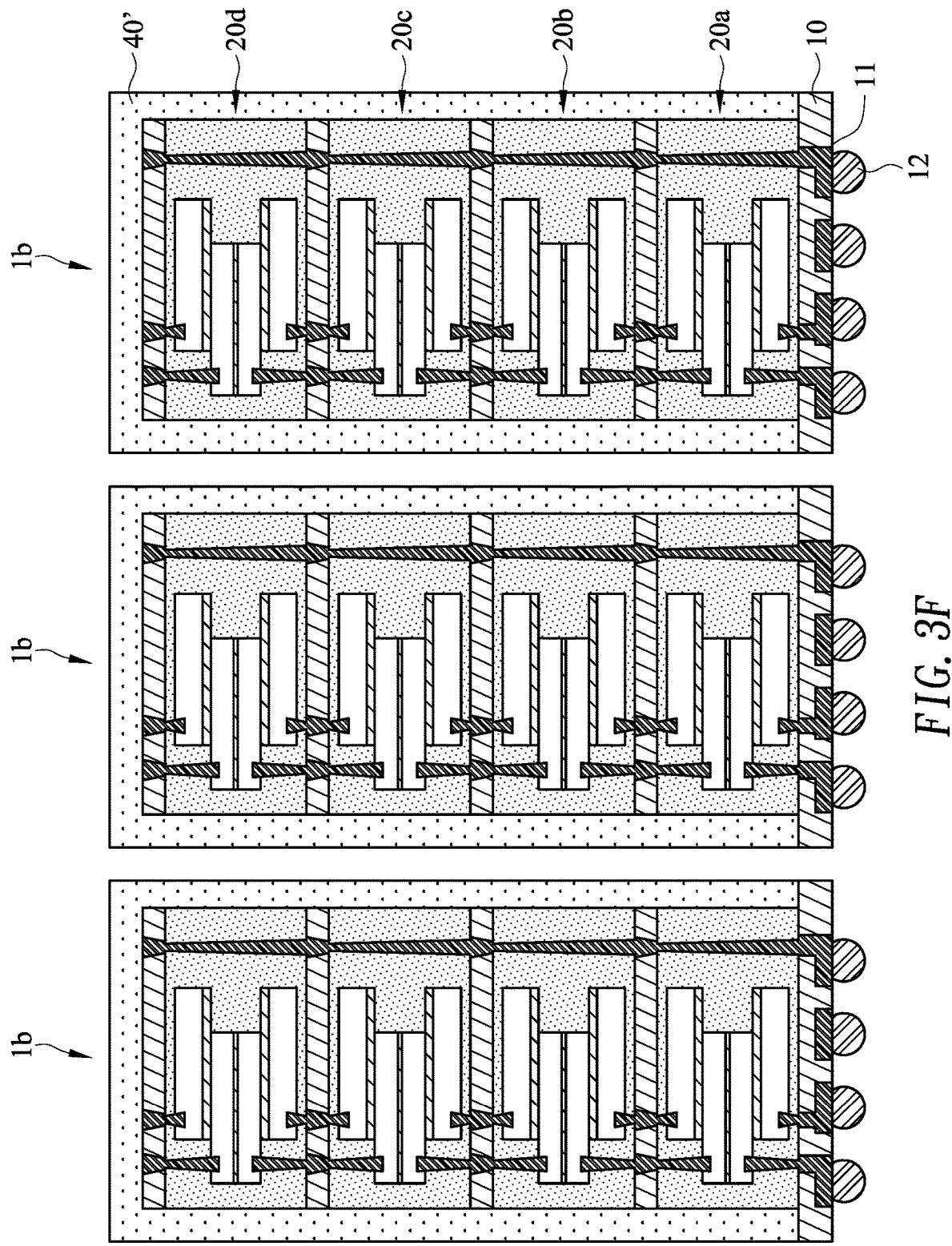

With reference to FIGS. 3E and 3F, in the step (f), the second molding compound 40 is cut along adjacent edges of the device areas 51 to form a plurality of modular stacked semiconductor packages 1b with N tiers. In this embodiment, each of the modular stacked semiconductor packages 1b has four tiers with the chip modules 20a-20d encapsulated by the second encapsulation 40'. With reference to FIG. 3B, each of the chip modules 20a-20d has the stacked bare chip group 30. Each of the bare chip groups 30 has the four bare chips 30a-30d, wherein the lower bare chips 30a and 30b are stacked misaligning with each other with facing to the same direction and correspond to the second pad group 211, the upper bare chips 30c and 30d are stacked misaligning with each other with facing to the same direction and correspond to the first pad group 212, the middle bare chips 30b and 30c are completely mounted back by back.

With the foregoing descriptions of the embodiments, the chip modules are fabricated in advance. Each of the chip modules has the stacked bare chips. When the chip modules are used to the manufacture stacked package, the issue of bad electrically connection between the bare chips in the chip module caused by positioning error is drastically reduced. Then the yield of package method of stacked semiconductor package method with stacked multiple tiers is also enhanced.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A package method of modular stacked semiconductor package comprising steps of:
   (a) providing a first carrier and N*M chip modules, wherein the first carrier has M device areas, and each of the chip modules has:
      a first encapsulation;
      a bare chip group encapsulated by the first encapsulation;
   (b) forming a first redistribution layer on each of the device areas on the first carrier;
   (c) stacking the N chip modules on the first redistribution layer on each of the device areas of the first carrier and electrically connecting the N chip modules to each other;
   (d) forming a second molding compound on the first redistribution layer on each of the device areas on the first carrier to encapsulate the N*M chip modules;
   (e) removing the first carrier to expose a surface on each of the first redistribution layers, and forming a plurality of solder balls on the surfaces of the first redistribution layers; and
   (f) cutting the second molding compound along adjacent edges of the device areas to form a plurality of modular stacked semiconductor packages with N tiers, wherein each of the chip modules further has:
a second redistribution layer formed on the bare chip group encapsulated by the first encapsulation;
at least one conductive via formed through the first encapsulation;
a first pad group formed on a first exposed surface of the first encapsulation; and
a second pad group formed on a second exposed surface of the second redistribution layer, wherein at least one pad of the first pad group corresponds to at least one pad of the second pad group; and the at least one conductive via connects to the first pad group and the second pad group.

2. The package method as claimed in claim 1, wherein the step (c) comprises steps of:
(c1) disposing the first pad groups of the chip modules in a first tier toward the first carrier, electrically connecting the first pad groups of the chip modules in the first tier to the first redistribution layers on the corresponding device areas, and disposing the second pad groups of the chip modules in the first tier away from the first redistribution layers;
(c2) disposing and electrically connecting the first pad group of each of the chip modules in next one of the tiers to the second pad group of each of the chip modules in previous one of the tiers, and disposing the second pad groups of the chip modules in the next one of the tiers away from the first redistribution layers; and
(c3) repeating the step (c2) until the chip modules stacking N tiers.

3. The package method as claimed in claim 2, wherein the bare chip group of each of the chip modules has two first bare chips stacked back to back with four sides respectively aligning with each other;
a first metal pad on an active surface of one of the first bare chips is electrically connected to one of the first pad groups; and
a first metal pad on an active surface of the other one of the first bare chips is electrically connected to one of the second pad groups.

4. The package method as claimed in claim 3, wherein the bare chip group of each of the chip modules further comprises two second bare chips;
each of the second bare chips has a rear surface mounted on the active surface of a corresponding one of the first bare chips;
a second metal pad on an active surface of one of the second bare chips and the first metal pad on the active surface of the corresponding first bare chip are electrically connected to one of the first pad groups; and
a second metal pad on an active surface of the other one of the second bare chips and the first metal pad on the active surface of the corresponding first bare chip are electrically connected to one of the second pad groups.

5. The package method as claimed in claim 4, wherein each of the chip modules is fabricated by following steps:
(s1) providing a second carrier, the first bare chips and the second bare chips, wherein the second carrier has a plurality of modular areas;
(s2) forming the second redistribution layer on each of the modular areas on the second carrier;
(s3) flip-chip bonding the first metal pad on the active surface of each of the second bare chips in a first tier on one of the second redistribution layers;
(s4) mounting the active surface of each of the first bare chips in a second tier on the rear surface of one of the flip-chip bonded second bare chips in the first tier, and flip-chip bonding the first metal pad on the active surface of each of the first bare chips in the second tier on one of the second redistribution layers;
(s5) mounting the rear surface of each of the first bare chips in a third tier on the rear surface of one of the flip-chip bonded first bare chips in the second tier, disposing the first metal pad on the active surface of each of the first bare chips in the third tier away from the second redistribution layers;
(s6) mounting the rear surface of each of the second bare chips in a fourth tier on the active surface of one of the first bare chips in the third tier, disposing the first metal pad on the active surface of each of the second bare chips in the fourth tier away from the second redistribution layers;
(s7) forming a first molding compound on the second redistribution layers to encapsulate the first bare chips and the second bare chips;
(s8) forming multiple holes through the first molding compound, wherein each of the modular areas corresponds to at least one of the holes;
(s9) forming the conductive via by filling the holes with metal materials;
(s10) polishing the first molding compound to expose the first metal pads on the active surfaces of the first bare chips in the third and fourth tier, wherein one end of each of the conductive vias is exposed out of the first molding compound, and the exposed first metal pads and the exposed ends of the conductive vias constitute the first pad groups; and
(s11) cutting the first molding compound along adjacent edges of the modular areas to form the chip modules.

6. The package method as claimed in claim 5, wherein the holes are electroplated to be filled with the metal materials to form the conductive vias.

7. The package method as claimed in claim 3, wherein each of the chip modules is fabricated by following steps:
(s1) providing a second carrier and the first bare chips, wherein the second carrier has a plurality of modular areas;
(s2) forming the second redistribution layer on each of the modular areas on the second carrier;
(s3) flip-chip bonding the first metal pads on the active surfaces of some of the first bare chips on the second redistribution layers;
(s4) mounting the rear surfaces of other of the first bare chips on the rear surfaces of the flip-chip bonded first bare chips, and disposing the first metal pads on the active surface of other of the first bare chips away from the second redistribution layers;
(s5) forming a first molding compound on the second redistribution layers to encapsulate the first bare chips;
(s6) forming multiple holes through the first molding compound, wherein each of the modular areas corresponds to at least one of the holes;
(s7) forming the conductive vias by filling the holes with metal materials;
(s8) polishing the first molding compound to expose the first metal pads on the active surfaces of the first bare chips in step (s4), wherein one end of each of the conductive vias is exposed out of the first molding compound, and the exposed first metal pads and the exposed ends of the conductive vias constitute the first pad groups; and
(s9) cutting the first molding compound along adjacent edges of the modular areas to form the chip modules.

8. The package method as claimed in claim 7, wherein the holes are electroplated to be filled with the metal materials to form the conductive vias.

9. The package method as claimed in claim 2, wherein the bare chip group of each of the chip modules comprises more than two bare chips, the bare chips are stacked misaligning with each other with the active surfaces facing to the same direction to expose a metal pad on the active surface of each of the bare chips, the metal pads correspond to the second pad groups.

10. The package method as claimed in claim 9, wherein each of the chip modules is fabricated by following steps:
- (s1) providing a second carrier and the bare chips; wherein the second carrier has a plurality of modular areas;
- (s2) forming the second redistribution layer on each of the modular areas on the second carrier;
- (s3) flip-chip bonding the first metal pad on the active surface of some of the bare chips on the second redistribution layers;
- (s4) mounting the active surfaces of other of the bare chips on the rear surfaces of the bare chips flip-chip bonded on the second redistribution layers, flip-chip bonding the first metal pads on the active surfaces of other of the bare chips on the second redistribution layers;
- (s5) forming a first molding compound on the second redistribution layers to encapsulate the bare chips;
- (s6) forming multiple holes through the first molding compound, wherein each of the modular areas corresponds to at least one of the holes;
- (s7) forming the conductive vias by filling the holes with metal materials, wherein one end of each of the conductive vias is exposed out of the first molding compound and constitute the first pad groups; and
- (s8) cutting the first molding compound along adjacent edges of the modular areas to form the chip modules.

11. The package method as claimed in claim 10, wherein the holes are electroplated to be filled with the metal materials to form the conductive vias.

\* \* \* \* \*